(12) United States Patent
Absar et al.

(10) Patent No.: US 7,369,989 B2
(45) Date of Patent: May 6, 2008

(54) UNIFIED FILTER BANK FOR AUDIO CODING

(75) Inventors: Mohammed Javed Absar, Singapore (SG); Sapna George, Singapore (SG)

(73) Assignee: STMicroelectronics Asia Pacific Pte, Ltd., Singapore (SG)

( * ) Notice: Subject to any disclaimer, the term of this patent is extended or adjusted under 35 U.S.C. 154(b) by 539 days.

(21) Appl. No.: 10/479,952

(22) PCT Filed: Jun. 8, 2001

(86) PCT No.: PCT/SG01/00113

§ 371 (c)(1),
(2), (4) Date: Aug. 16, 2004

(87) PCT Pub. No.: WO02/101726

PCT Pub. Date: Dec. 19, 2002

(65) Prior Publication Data

US 2004/0267542 A1 Dec. 30, 2004

(51) Int. Cl.
*G10L 19/02* (2006.01)
*G06F 17/14* (2006.01)

(52) U.S. Cl. .................. 704/203; 704/500; 708/402

(58) Field of Classification Search ............ 704/500, 704/501, 503, 203; 708/300, 313, 400, 402, 708/404, 405
See application file for complete search history.

(56) References Cited

U.S. PATENT DOCUMENTS 5,732,189 A * 3/1998 Johnston et al. ............ 704/230
5,852,806 A * 12/1998 Johnston et al. ............ 704/500
6,304,847 B1 * 10/2001 Jhung ......................... 704/500
6,343,304 B1 * 1/2002 Yang et al. .................. 708/402
6,430,529 B1 * 8/2002 Huang ........................ 704/229

OTHER PUBLICATIONS

J. Princen, "The Design of Non-Uniform Modulated Filterbanks", IEEE Transactions on Signal Processing, Nov. 1995, vol. 43, Issue 11, pp. 2550 to 2560.*
Koilpillai, R. et al., "Cosine-Modulated FIR Filter Banks Satisfying Perfect Reconstruction," *IEEE Transactions on Signal Processing* 40(4):770-783, Apr. 1992.
Nguyen, T. et al., "The Theory and Design of Arbitrary-Length Cosine-Modulated Filter Banks and Wavelets, Satisfying Perfect Reconstruction," *IEEE Transactions on Signal Processing* 40(3):473-483, Mar. 1996.
Pan, D., "A Tutorial on MPEG/Audio Compression," (IEEE Computer Society) *IEEE Multimedia* 2(2):60-74, 1995.
Heller, P., et al., "A General Formulation of Modulated Filter Banks," *IEEE Transactions on Signal Processing*, 47(4):986-1001, Apr. 1999.

* cited by examiner

*Primary Examiner*—Martin Lerner
(74) *Attorney, Agent, or Firm*—Lisa K. Jorgenson; Robert Iannucci; Seed IP Law Group PLLC

(57) ABSTRACT

A unified filter bank for use in encoding and decoding MPEG-1 audio data, wherein input audio data is encoded into coded audio data and the coded audio data is subsequently decoded into output audio data. The unified filter bank includes a plurality of filters, with each filter of the plurality of filters being a cosine modulation of a prototype filter. The unified filter bank is operational as an analysis filter bank during audio data encoding and as a synthesis filter bank during audio data decoding, wherein the unified filter bank is effective to substantially eliminate the effects of aliasing, phase distortion and amplitude distortion in the output audio data.

23 Claims, 3 Drawing Sheets

Magnitude response of the modulated filters $Q_k(z)$

Magnitude response of the modulated filters $Q_k(z)$

UNIFIED FILTER BANK FOR AUDIO CODING

This invention relates to audio coding, and in particular to methods and apparatus for audio compression and decompression.

The Motion Picture Experts Group MPEG-1 audio compression algorithm is an International Organisation for Standardisation (ISO) standard for high fidelity audio compression. MPEG-1 offers a choice of three independent layers of compression. These layers provide a wide range of tradeoffs between CODEC (coder/decoder) complexity and compressed audio quality.

Layer I is the simplest layer and is best suited for bit rates above 128 kbits/sec per channel. For example, Phillips Digital Compact Cassette (DCC) uses Layer I compression at 192 kbits/sec per channel. This layer contains the basic mapping of the digital audio input into 32 sub-bands, fixed segmentation to format the data into blocks, a psychoacoustic model to determine the adaptive bit allocation, and quantising using block compounding and formatting.

Layer II is an enhancement of Layer I. It improves the coding performance by coding data in larger groups. The layer has intermediate complexity and is targeted for bit rates around 128 kbits/s per channel.

Layer III is the most complex of the three layers, but offers the best audio quality, particularly at bit-rates around 64 kbits/sec. The Layer III MPEG-1 CODEC incorporates the analysis filter bank of MPEG-1 Layer I and compensates for its deficiencies by increasing the frequency resolution by further processing its output using a Modified Discrete Cosine Transform (MDCT). The resultant hybrid system has relatively high complexity and a relatively high computational load. Further, the hybrid system does not prevent or remove the effects of aliasing.

The analysis filter bank used in the Layer I algorithm is in fact found in all three layers of MPEG-1 CODECs. The analysis filter bank and its inverse (a synthesis filter bank) do not form a perfect reconstruction (PR) system. The 32 constant width bands do not accurately reflect the ear's critical bands. The bandwidth is generally too wide for lower frequencies and as a consequence the number of quantisers cannot be tuned specifically for the noise sensitivity within each band.

A prototype filter, the filter from which the filters of the analysis bank are cosine modulations, is an approximate spectral factor of an Mth band filter. It provides near perfect reconstruction (NPR). As such, the analysis filter bank and its inverse do not have paraunitary characteristics, ie their respective transformations are not lossless. Therefore, even under high transmission-bandwidth conditions the system suffers audible degradation.

An MPEG-1 Layer I CODEC 1, shown in block diagram form in FIG. 1, generally comprises two sections, an encoder (also referred to as a coder) 2 and a decoder 4. The encoder 2 includes an analysis filter bank 6 which receives input audio data and divides that input audio data into multiple frequency sub-bands. Simultaneously, the input audio data is processed by a psychoacoustic model 8 that determines the ratio of signal energy to a masking threshold for each mentioned sub-band. A bit allocation section 3 receives signal-to-mask ratios from the psychoacoustic model 8 and determines how to apportion the total number of code bits available for the quantization of the sub-band signals in order to minimise the audibility of quantisation noise. A bit stream formatting section 5 generally receives the representations of the quantized sub-bands and formats that data together with side information to produce an encoded bit stream.

The decoder 4 receives the encoded bit stream and removes the side information in a bit stream unpacking stage 7. The quantised sub-band values are restored in an inverse quantisation stage 10, and the audio signal reconstructed from the subband values in a synthesis filter bank stage 11. The synthesis filter bank II is essentially the inverse of the analysis filter bank 6 employed in the encoder 2.

The Layer I analysis filter bank 6 and its respective inverse 11, shown in FIG. 2 are an integral part of each layer of MPEG-1. The analysis filter bank 6 divides the audio signal into 32 equal width frequency subbands; Each filter $H_k(z)$ 22 of the analysis filter bank 6 is a cosine modulation of a prototype filter (often called a window in the context of a transform coder). Although the prototype is linear phase, the analysis and synthesis filters, which are cosine modulations of the prototype, are not. The prototype filter is an approximate spectral factor of an $M^{th}$ band filter and thereby only provides Near Perfect Reconstruction, as detailed for example in D. Koilpillai, P. P. Vaidyanathan. "A Spectral Factorization Approach to Pseudo QMF Design". Proc. IEEE Intl. Symp. Circuits and Systems pp. 160-163, Singapore June 1991.

A MPEG-1 Layer III CODEC achieves additional frequency resolution by the use of a hybrid filter bank 30, represented in block diagram form in FIG. 3. In this case each sub-band 32 is further split into 18 frequency sub-bands 34 by use of an MDCT (Modified Discrete Cosine Transform). The MDCT employs a windowing operation with window length of 36. An adaptive window switching technique may be employed when the system is exposed to transient conditions. Although MDCT originated from Lapped Orthogonal Transforms it can be shown to have a mathematically equivalent interpretation as a filter bank, as explained hereinbelow.

A two-channel, ie M=2, analysis and synthesis system based on arbitrary filter design would generally exhibit three types of errors:
aliasing;
amplitude distortion and
phase distortion It is known that aliasing can be completely eliminated in such a system by correct choice of synthesis filters. It was later shown that a two-channel QMF (Quadrature Mirror Filter) with correctly designed FIR filters can eliminate all three types of distortion in a filter bank. A system, that can eliminate the effects of aliasing, phase distortion and amplitude distortion, is known in the art as a perfect reconstruction system. The above mentioned techniques are described, for example, in Smith M. J. T. and Barnwell T. P. "A procedure for designing exact reconstruction filter banks for tree structured subband coders"; Proc. IEEE International Conference Acoustic, Speech and Signal, Processing, pp. 27.1.1-27.1.4 1984.

A Pseudo QMF technique was developed by Nussbaumer, H.J., ("Pseudo QMF filter bank", IBM Technical Disclosure Bulletin, Vol. 24, pp. 3081-3087, No. 1981), which provides a technique for approximate aliasing cancellation in M channel filter banks.

The general theory of Perfect Reconstruction in M channel filter banks was developed by a number of authors. Vetterli and Vaidyanathan independently showed that the use of polyphase components leads to a considerable simplification of the theory of perfect reconstruction. A technique for the design of M channel perfect reconstruction systems based on polyphase matrices with the so-called paraunitary (lossless) properties was developed by Vaidyanathan, and was detailed in Vaidyanathan P. P., "Multirate Systems and Filter Banks" Prentice Hall Signal Processing Series, 1992.

A particular class of M-channel filter banks which effect perfect reconstruction systems was developed by Malvar, Koilpillai and Vaidyanathan, and Ramstad, with the property that all the analysis and synthesis filters, of respective analysis and synthesis filter banks, were derived, starting from a prototype filter, by modulation.

Before the development of filter banks with paraunitary properties, some authors had independently reported other techniques for perfect recovery systems which work for the case where the temporal resolution, filter order N, is constrained by N+1=2M (M is the decimation factor). One of these was the aforementioned Lapped Orthogonal Transform (LOT). A similar concept is used in the Layer III hybrid system 30, which accounts for the fact that the overlap (18) is half the window size (36), as previously mentioned. ALOT is equivalent, in the framework of a multi-rate system, to a filter bank with paraunitary properties and therefore also exhibits the perfect reconstruction property.

In a paper prepared by Koilpillai and Vaidyananthan, (Koilpillai D. and Vaidyananthan P. P., "Cosine-Modulated FIR Filter Banks satisfying Perfect Reconstruction", IEEE Transaction on Signal Processing, vol SP-40, pp. 770-783, 1992), the necessary and sufficient condition on the 2M polyphase components of a linear phase prototype filter of length N+1=2 mM (where m is an arbitrary positive integer) was prescribed such that the polyphase component matrix of the modulated filter was lossless. They used the losslessness of the analysis/synthesis system to implement Perfect Reconstruction filter banks using the lattice structures described in Vaidyananthan P. P. and Hoang P, ("Lattice structures for optimal design and robust implementation of two-channel perfect reconstruction QMF banks", IEEE Transaction on Acoustic, Speech and Signal Processing vol. ASSP-36, pp 81-94, 1988).

In 1996 Nguyen and Koilpillai, in their paper Nguyen T. Q. And Koilpillai D., "The Theory and Design of Arbitrary Length cosine modulated filter banks and wavelets, satisfying perfect reconstruction", IEEE Transaction on Acoustic, Speech and Signal Processing vol. ASSP-44, pp 473-483, 1996, derived a perfect reconstruction system for the case where the filter length is N+1=2 mM+$m_1$.

The hybrid filter structure 30 shown in FIG. 3 (i.e. Polyphase 31+MDCT 33) generally complicates the implementation of the filter, has a high computational load and therefore requires an excessive amount of memory transfers. As a consequence, the hybrid structure 30 consumes a lot of power. Further, the Layer I filter bank does not provide a Perfect Reconstruction System and even at high bit rates, audio signals suffer unnecessary degradation Also, as stated in Sporer T., Bradenburg K. and Elder B., ("The use of multi rate filter banks for coding of high quality digital audio" EUSIPCO 1992), cascading the polyphase filter bank to the MDCT results in aliasing problems due to the frequency response of the polyphase filters being originally designed for non-cascaded applications.

It is desirable to alleviate the difficulties and short comings associated with the above-mentioned known solutions to audio compression, or at least provide a useful alternative.

In accordance with the present invention there is provided an MPEG-1 CODEC, including an encoder, where the encoder has means for effecting an analysis filter bank, and a decoder, where the decoder has means for effecting a synthesis filter bark, wherein a unified filter bank is the means for effecting the analysis filter bank and a functional inverse of the unified filter bank is the means for effecting the synthesis filter bank, wherein the unified filter bank includes a plurality of filters, where each filter of the plurality of filters is a cosine modulation of a prototype filter, $P_0(Z)$, wherein the prototype filter includes a plurality of polyphase components, $G_k(Z)$, which substantially satisfy the following:

$$\tilde{G}_k(z)G_k(z) + \tilde{G}_{M+k}(z)G_{M+k}(z) = \frac{1}{2M}$$

where $G_k(z)$, for $0 \leq k \leq M-1$, are the polyphase components of the prototype filter, $\tilde{G}_k(z)$ is the conjugate transpose of $G_k(z)$;

M is the decimation factor of the prototype filter, and k is an integer.

In accordance with the present invention there is also provided a method for encoding and decoding audio data in a MPEG-1 Layer III CODEC wherein input audio data is encoded into coded audio data and said coded audio data is decoded into output audio data, including subjecting the input audio data to an analysis filter bank during encoding, and a synthesis filter bank during decoding, wherein a unified filter bank comprises the analysis filter bank and a functional inverse of the unified filter bank comprises the synthesis filter bank, the unified filter bank including a plurality of filters, where each filter of the plurality of filters is a cosine modulation of a prototype filter, $P_0(Z)$, wherein:

the temporal resolution, N, of the prototype filter is substantially N+1=1632;

the decimation factor, M, of the prototype filter is substantially M=576;

the bandwidth of the prototype filter is substantially π/M; and the prototype filter substantially satisfies the following constraint:

$$\tilde{G}_k(z)G_k(z) + \tilde{G}_{M+k}(z)G_{M+k}(z) = \frac{1}{2M}$$

Where, $G_k(Z)$, for $0 \leq k \leq M-1$, are the polyphase components of the prototype filter; $\overline{G}_k(z)$ is the conjugate transpose of $G_k(z)$; and k is an integer.

The invention is flyer described by way of example only with reference to the accompanying drawings, in which.

An embodiment of the invention provides a unified analysis (and synthesis) filter bank which has the same temporal resolution, N, and frequency selectivity (sub-band width) as the above-described hybrid system of a MPEG-1 Layer III CODEC. It is therefore useful to determine the specification for the hybrid system 30, which may be examined with reference to the temporal resolution of MPEG-1 Layer III hybrid filter bank 40, diagrammatically illustrated in FIG. 4.

Figure 4:
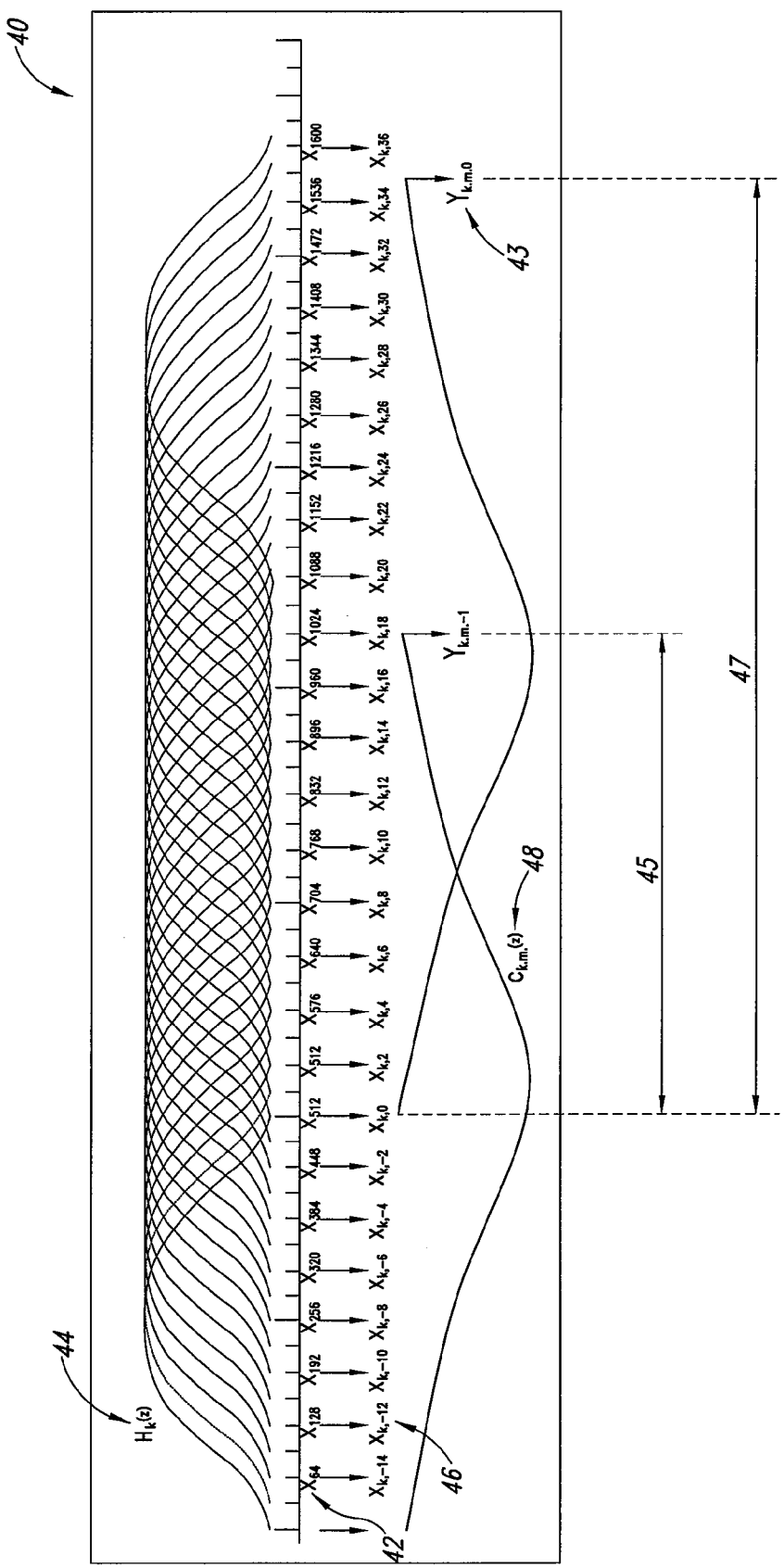
FIG. 4 shows the temporal resolution of MPEG-1 Layer III hybrid analysis filter bank.

In FIG. 4, audio samples 42 are time labelled as $x_0$, $x_1$, .... Only every $64^{th}$ sample is labelled for clarity. Each polyphase filter $H_k(Z)$ 44, has filter length of 512, Sub-band values 46 of $H_k(Z)$ 44 are labelled $x_{k,0}$, $x_{k,1}$, .... Since the decimation factor of the Layer I analysis filter bank is equal to 32, the filter shifts by 32 samples before convoluting and generating the next output 43.

The MDCT 33 has a prototype filter length of 36. $C_{k,m}(z)$ 48 refers to the $m^{th}$ MDCT filter which takes input from $H_k(z)$ 44. From FIG. 4, it can be seen that the temporal resolution 47 of the combined system is 1632, ie 32*35+512=1632.

From FIG. 4 the decimation factor, M, for the overall system can be seen to be 576, indicated by reference numeral 45. This value is equivalent to the product of the decimation factors of the two stages of the hybrid system 30 ie the Layer I analysis filter bank and the MDCT, i.e. 32*18=576.

The bandwidth of each Layer I filter, $H_k(Z)$ 44, is $\pi/M=\pi/32$. The resulting sub-band values 46 of the Layer I filters $H_k(Z)$ are further decomposed by into 18 sub-band values 34, for example. Therefore, the combined band-width for each output of the hybrid system 30 is $\pi/(32*18)=\pi/(576)$.

In this example of the invention a perfect reconstruction system with prototype filter length N+1=1632, decimation factor M=576 and cut-off bandwidth of $\pi/(M)=\pi/576$ can replace the MPEG-1 Layer III hybrid system without affecting other operations of the CODEC.

An example of the unified filter bank, perfect reconstruction system, of the present invention is described with reference to the derivation of the perfect reconstruction system, for the case where the filter length is N+1=2 $mM+m_1$, as referred to above.

Construction of a perfect reconstruction filter bank is defined by way of an evolution from the Pseudo QMF (with near perfect reconstruction). Accordingly, consider a uniform DFT (Discrete Fourier Transform) analysis bank with 2M filters that are related according to:

$$P_k(z) = P_0(zW^k) \qquad (1)$$

i.e., $$p_k(n) = p_0(n)W^{-kn} \qquad (2)$$

where $P_0(z)$ is a prototype filter.

The impulse response is real, such that $|P_0(e^{-j\omega})|$ is symmetric about $\omega=0$. The polyphase components of the prototype $P_0(z)$ are $G_k(z)$, $0 \leq k \leq 2M-1$, ie:

$$P_0(z) = \sum_{k=0}^{2M-1} [z^{-k} G_k(z^{2M})] \qquad (3)$$

The set of 2M responses are right shifted in order to make all the filter bandwidths equal after combining negative and positive pairs. The new filters are given by:

$$Q_k(z) = P_0(zW^{k+0.5}) \qquad (4)$$

where $$W = W_{2M} = e^{-j2\pi/2M}$$

Figure 1:
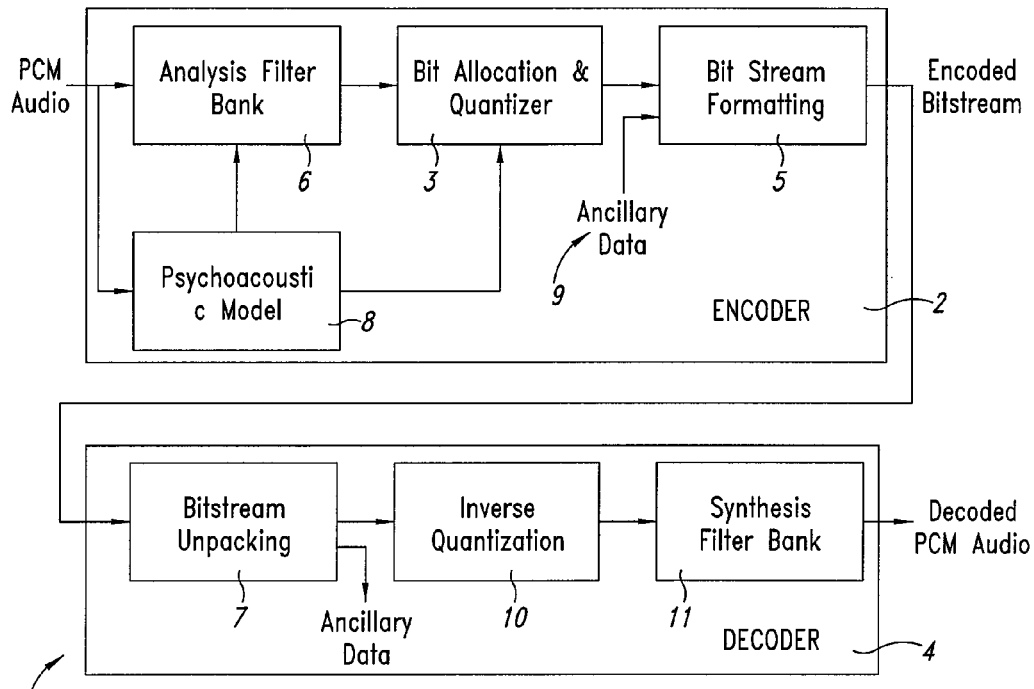
FIG. 1 is a block diagram of an MPEG-1 Layer I CODEC.
Figure 2:
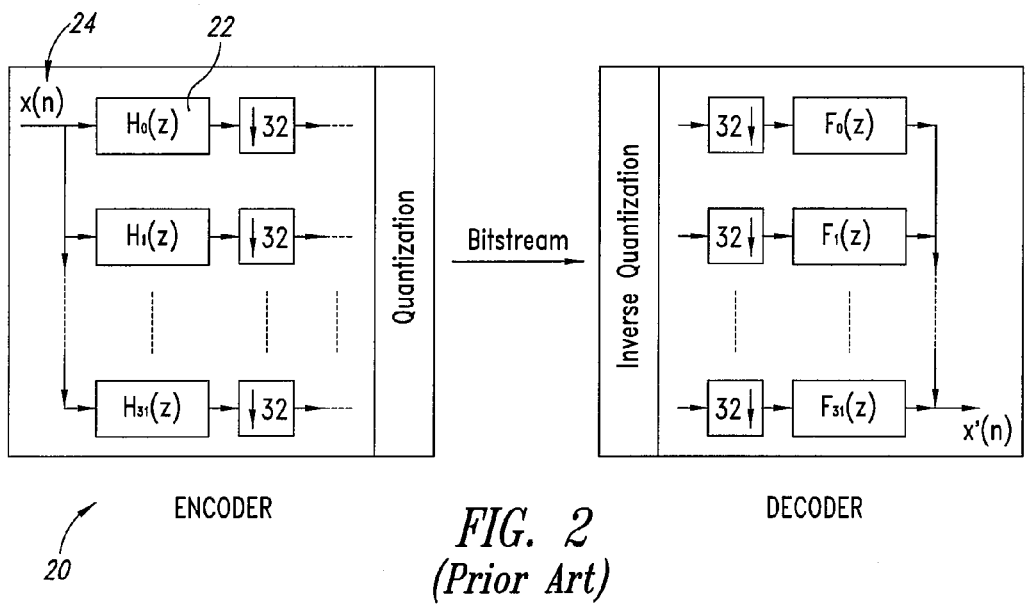
FIG. 2 is a block diagram of a decomposition of an analysis filter bank and a synthesis filter bank in MPEG-1 layer I CODEC.
Figure 3:
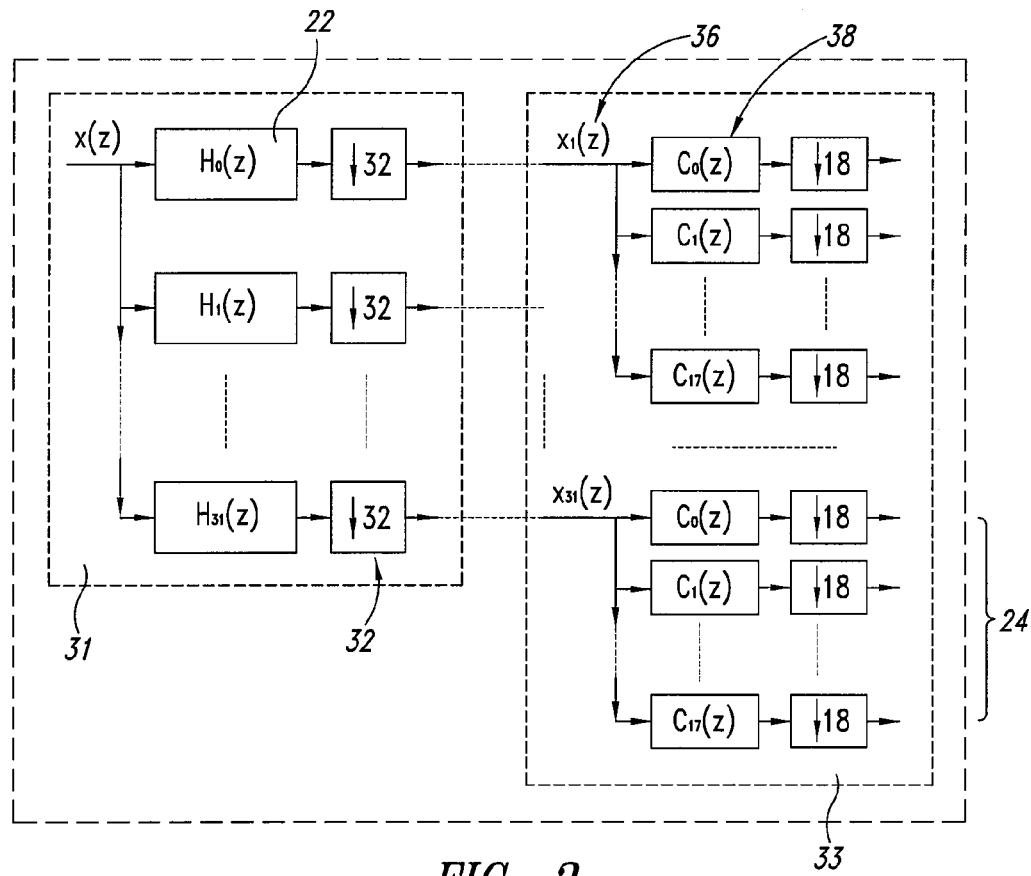
FIG. 3 is a block diagram of a hybrid analysis system in an MPEG-1 Layer III CODEC.
Figure 5:
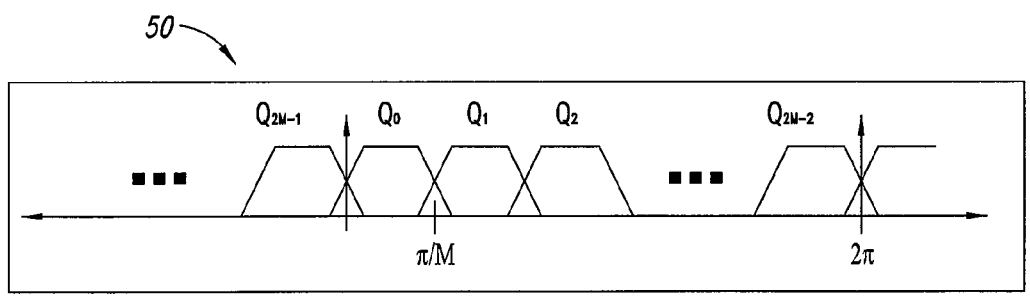
FIG. 5 shows the magnitude response of the modulated filters $Q_k(z)$ in accordance with the invention.

The magnitude responses of $Q_k(Z)$ and $Q_{2M-1-k}(z)$, shown at 50 in FIG. 5, are now images of each other about $\omega=0$, i.e. $|Q_k(e^{-j\omega})|$ and $|Q_{2M-1-k}(e^{-j\omega})|$.

Accordingly, let:

$$U_k(z) = c_k P_0(zW^{k+0.5}) \qquad (5)$$

$$= c_k Q_k(z) \qquad (6)$$

and $$V_k(z) = c_k^* P_0(zW^{-(k+0.5)}) \qquad (7)$$

$$= c_k^* Q_{2M-1-k}(z) \qquad (8)$$

The M analysis filter banks can now be regarded as:

$$H_k(z) = a_k U_k(z) + a_k^* V_k(z), \quad 0 \leq k \leq M-1 \qquad (9)$$

where $a_k$ and $c_k$ are unit magnitude constants;

* denotes the conjugation of the respective coefficients; and $W = W_{2M} = e^{-j2\pi/2M}$ The decimated output of the analysis filter banks, $H_k(z)$, gives rise to alias components:

$$H_k(zW_M^l)X_k(zW_M^l), \text{ for all } l \qquad (10)$$

A synthesis filter $F_k(Z)$, whose passband coincides with that of the analysis filter, $H_k(z)$, retains the unshifted version $H_k(z)X_k(z)$, and also permits a small leakage of the shifted versions. In accordance with Pseudo QMF philosophy, the filters are all designed in such a way that when the output of all the M synthesis filters are added together, the leakage (aliasing) are all mutually cancelled. Since the passbands of the synthesis filter, $F_k(z)$, should coincide with those of the analysis filter, $H_k(z)$, we are able to derive:

$$F_k(z) = b_k U_k(z) + b_k^* V_k(z), \quad 0 \leq k \leq M-1 \qquad (11)$$

where $b_k$ is a unit magnitude constant.

In general, the output of $F_k(z)$ has the aliasing components:

$$H_k(zW_M^l)X_k(zW_M^l), \text{ for all } l \text{ i.e. } 0 \leq k \leq M-1 \qquad (12)$$

However, if the stopband attenuation of $F_k(z)$ is sufficiently high, only some of these components are of importance. Consequently, in the Near Perfect Reconstruction case only those components are designed for cancellation. This leads to the constraint:

$$a_k b_k^* = -a_{k-1} b_{k-1}^*, \quad 1 \leq k \leq M-1 \qquad (13)$$

Assuming that the aliasing is cancelled, the transfer function for the output is in accordance with Equation 14:

$$T(z) = \frac{1}{M} \sum_{k=0}^{M-1} F_k(z) H_k(z) \qquad (14)$$

If the transfer function T(z) is linear phase, the filter will be free from phase distortion. This quality may be ensured by choosing:

$$f_k(n) = h_k(N-n) \qquad (15)$$

or equivalently:

$$F_k(z) = z^{-N} \tilde{H}_k(z) \qquad (16)$$

where $\tilde{H}(z)$ is the conjugate pose of H(z);

* denotes the conjugation of the coefficients; and

Given the above-mentioned considerations, one example of the invention prescribes:

$$a_k = e^{j\theta(k)} \quad (17)$$

$$b_k = a_k^* = e^{-j\theta(k)} \quad (18)$$

$$c_k = W^{(k+0.5)N/2} \quad (19)$$

where $\theta(k) = (-1)^k \pi/4$

It is therefore possible to derive:

$$h_k(n) = 2p_0(n)\cos(\pi/M(k+0.5)(n-N/2)+\theta_k) \quad (20)$$

$$f_k(n) = 2p_0(n)\cos(\pi/M(k+0.5)(n-N/2)-\theta_k) \quad (21)$$

Thus, the analysis filter (Equation 20), and the synthesis filter Equation 21), are related to the prototype $p_0(n)$ by cosine modulation.

From the above-described requirements and with the aim of achieving perfect reconstruction, the condition on the prototype for perfect reconstruction can be derived A prototype derivation for the case N+1=2 mM is provided by Vaiyanathan P. P., "Multirate Systems and Filter Banks", Prentice Hall Signal Processing Series. 1992.

Where N+1=2 mM+m$_1$ the derivation is given by Nguyen T. Q. and Koilpillai D., "The theory and design of arbitrary length cosine modulated filter banks and wavelengths, satisfying perfect reconstruction", IEEE Transaction on Acoustic, Speech and Signal Processing, vol. ASSP-"44, pp. 473-483, 1996.

$$\tilde{G}_k(z)G_k(z) + \tilde{G}_{M+k}(z)G_{M+k}(z) = \frac{1}{2M} \quad (22)$$

Equation 22 is known to those skilled in the art to represent the sufficient conditions of the polyphase components of a prototype for perfect reconstruction.

To obtain good frequency selectivity for each of the sub-bands, the prototype filter is designed as a lowpass prototype filter $P_0(Z)$ with high stop band attenuation. The 2M polyphase components, $G_k(z)$, must also satisfy the perfect reconstructions conditions of equation (22).

A method for designing a prototype which automatically satisfies the perfect reconstruction constraint of Equation (22) is through a Paraunitary QMF Lattice structure described in Vaiyanathan P. P., "Multirate Systems and Filter Banks", Pentice Hall Signal Processing Series. 1992. Here, the design method consists of optimizing rotation angles so that the stop band attenuation of the resulting prototype filter is minimized. The optimization time can be prohibitive since the cost function (stop band attenuation) is a highly non-linear function with respect to the rotation angles.

Instead of optimizing in the rotation angle space, a design formulation which uses the filter coefficients directly is proposed by Nguyen T., "A Quadratic-Least Square approach to the design of digital filter banks", International Symposium on Circuits and system, pp1344 to 1348, 1992. In his approach, the cost function and the perfect reconstruction condition of Equation (22) are expressed as quadratic functions of the filter coefficients. Since not all the constraint matrices are positive-definite the minimization is still a difficult optimization theory (mathematical programming) problem. The approach recommended by the author is based on linearizing of the quadratic constraint. It results in an approximate solution albeit the deviation from PR is very small.

In one example of the invention a unified MPEG-1 filter bank design with N+1=1632 and M=576. The polyphase components may be numerous (2M=1152), however, they are each of a low order. If the prototype filter is expressed as vector $h = [h_0 \; h_1 \; h_2 \; h_3 \; \ldots \; h_{1631}]^t$, then the polyphase components can be represented as:

$$G_0(z) = h_0 + h_{1152}z^{-1}$$

$$G_1(z) = h_1 + h_{1153}z^{-1}$$

$$G_{479}(z) = h_{479} + h_{1631}z^{-1}$$

$$G_{480}(z) = h_{480}$$

$$G_{481}(z) = h_{481}$$

$$G_{1151}(z) = h_{1151}$$

However, the fact that $h_n = h_{1631-n}$, a symmetric property of linear phase filters, reduces the number of unknowns by half. For example, consider the perfect reconstruction condition for k=0:

$$\tilde{G}_0(z)G_0(z) + \tilde{G}_{576}(z)G_{576}(z) = \frac{1}{1152} \quad (23)$$

This translates to:

$$(h_0 + h_{1152}z)(h_0 + h_{1152}z^{-1}) + (h_{576})(h_{576}) = h^2_0 + h_0 h_{1152}(z+z^{-1}) + h^2_{576} = 1 \quad (24)$$

This implies that at least one of $h_0$ or $h_{1152}$ must be zero. By choosing host $h_{1152}=0$ and $h_0=a$, $h_{576}=\sqrt{(1-a^2)}$. Furthermore, due to symmetry:

$$h_{1055} = h_{1631-1055} = h_{576} = \sqrt{(1-a^2)} \quad (25)$$

Also, $h_{1631} = h_0 = a$ and $h_{479} = h_{1631-479} = h_{1152} = 0$. From this we see that the number of unknowns is drastically reduced. This reduced set can be optimized for minimum stop band energy.

Due to the simplicity of the polyphase components of in the above-mentioned embodiments of the invention simplified constraint mapping can be performed.

In the above-mentioned examples of the invention, a FIR satisfying the perfect reconstruction constraint of Equation (22) and having reasonable frequency selectivity can be obtained by modifying certain coefficients where minimal changes occur in the frequency response. Using advanced optimization techniques (e.g. those based on Karsuch Kuhn Tucker's Theorem) better solutions may be obtained.

The invention claimed is:

1. An MPEG-1 CODEC, comprising:
    an encoder that includes means for effecting an analysis filter bank, wherein the means for effecting the analysis filter bank includes a unified filter bank; and
    a decoder that includes means for effecting a synthesis filter bank, wherein the means for effecting the synthesis filter bank includes a functional inverse of the unified filter bank, wherein the unified filter bank includes a plurality of audio signal filters, where each audio signal filter of the plurality of audio signal filters is a cosine modulation of a prototype filter, $P_0(Z)$, wherein the prototype filter includes a plurality of polyphase components, $G_k(Z)$, which substantially satisfy the following:

$$\tilde{G}_k(z)G_k(z) + \tilde{G}_{M+k}(z)G_{M+k}(z) = \frac{1}{2M}$$

where
$G_k(z)$, for $0 \leq k \leq M-1$, are the polyphase components of the prototype filter;
$\tilde{G}_k(z)$ is a conjugate transpose of $G_k(z)$;
M is a decimation factor of the prototype filter; and
k is an integer, wherein the MPEG-1 CODEC is a MPEG-1 Layer III CODEC
wherein:
the prototype filter has a temporal resolution, N, of substantially N+1=1632;
the decimation factor, M, of the prototype filter is substantially M=576; and
the prototype filter has a bandwidth of substantially $\pi/M$.

2. The MPEG-1 CODEC claimed in claim 1, wherein the MPEG-1 CODEC functions substantially in accordance with the following transfer function:

$$T(Z) = \frac{1}{M}\sum_{k=0}^{M-1} F_k(Z)H_k(Z);$$

$$h_k(n) = 2p_0(n)\cos(\pi/M(k+0.5)(n-N/2) + \theta_k);$$

$$f_k(n) = 2p_0(n)\cos(\pi/M(k+0.5)(n-N/2) + \theta_k); \text{ and}$$

$$F_k(z) = z^{-N}\tilde{H}_k(z);$$

where:
$H_k(Z)$ is a $k^{th}$ filter of the analysis filter bank;
$F_k(Z)$ is a $k^{th}$ filter of the synthesis filter bank;
$\tilde{H}_k(z)$ is a conjugate transpose of $H_k(z)$;
M is a decimation factor of the unified filter; and
N is a temporal resolution of the prototype filter.

3. The MPEG-1 CODEC claimed in claim 1, wherein the MPEG-1 CODEC functions substantially in accordance with the following transfer function:

$$T(Z) = \frac{1}{M}\sum_{k=0}^{M-1} F_k(Z)H_k(Z);$$

$$H_k(z) = a_k c_k P_0(zW^{k+0.5}) + a_k^* c_k^* P_0(zW^{-(k+0.5)}), \; 0 \leq k \leq M-1;$$

$$F_k(z) = b_k c_k P_0(zW^{k+0.5}) + b_k^* c_k^* P_0(zW^{-(k+0.5)}), \; 0 \leq k \leq M-1; \text{ and}$$

$$F_k(z) = z^{-N}\tilde{H}_k(z);$$

Where:
$H_k(Z)$ is a $k^{th}$ filter of the analysis filter bank;
$F_k(z)$ is a $k^{th}$ filter of the synthesis filter bank;
$\tilde{H}_k(z)$ is a conjugate transpose of $H_k(z)$;
$\tilde{G}_k(z)$ is a conjugate transpose of $G_k(z)$;
M is a decimation factor of the unified filter,
$a_k$, $b_k$ and $c_k$ are unit magnitude constants, wherein:

$$a_k b_k^* = -a_{k-1}b_{k-1}^*, \; 1 \leq k \leq M-1;$$

$$a_k = e^{j\theta(k)};$$

$$b_k = a_k^* = e^{-j\theta(k)};$$

$$c_k = W^{(k+0.5)} N/2; \text{ and}$$

wherein $\theta(k) = (-1)^k \pi/4$;
* denotes a conjugation of respective coefficients; and $$W = W_{2M} = e^{-j2\pi/2M}.$$

4. The MPEG-1 CODEC claimed in claim 1, wherein the prototype filter can be expressed as a vector $h = [h_1 \; h_2 \; h_3 \; \ldots \; h_{1631}]^t$ and the polyphase components, $G_k(z)$, of the prototype filter are:

$$G_0(z) = h_0 + h_{1152}z^{-1}$$

$$G_1(z) = h_1 + h_{1153}z^{-1}$$

$$G_{479}(z) = h_{479} + h_{1631}z^{-1}$$

$$G_{480}(z) = h_{480}$$

$$G_{481}(z) = h_{481}$$

$$G_{1151}(z) = h_{1151}.$$

5. The MPEG-1 CODEC claimed in claim 1, wherein said prototype filter is designed through a paraunitary Quadrature Mirror Filter Lattice structure.

6. A method for encoding and decoding audio data in a MPEG-1 Layer III CODEC that includes a unified filter bank, having an analysis filter bank, and synthesis filter bank that is a functional inverse of the unified filter bank, the method comprising:
encoding input audio data into coded audio data, the encoding step including subjecting the input audio data to the analysis filter bank; and
decoding the coded audio data into output audio data, the decoding step including subjecting the coded audio data to the synthesis filter bank, the unified filter bank including a plurality of filters, where each filter of the plurality of filters is a cosine modulation of a prototype filter, $P_0(Z)$, wherein:
the prototype filter has a temporal resolution, N, of substantially N+1=1632;
the prototype filter has a decimation factor, M, of substantially M=576;
the prototype filter has a bandwidth of substantially $\pi/M$; and
the prototype filter substantially satisfies the following constraint:

$$\tilde{G}_k(z)G_k(z) + \tilde{G}_{M+k}(z)G_{M+k}(z) = \frac{1}{2M}$$

where, $G_k(z)$, for $0 \leq k \leq M-1$ are polyphase components of the prototype filter; $\tilde{G}_k(z)$ is a conjugate transpose of $G_k(z)$; and k is an integer.

7. The method claimed in claim 6, wherein the MPEG-1 Layer III CODEC functions substantially in accordance with the following transfer function:

$$T(Z) = \frac{1}{M}\sum_{k=0}^{M-1} F_k(Z)H_k(Z);$$

$$h_k(n) = 2p_0(n)\cos(\pi/M(k+0.5)(n-N/2) + \theta_k);$$

$$f_k(n) = 2p_0(n)\cos(\pi/M(k+0.5)(n-N/2) + \theta_k); \text{ and}$$

$$F_k(z) = z^{-N}\tilde{H}_k(z);$$

where:
$H_k(Z)$ is a $k^{th}$ filter of the analysis filter bank;
$F_k(Z)$ is a $k^{th}$ filter of the synthesis filter bank;
$\tilde{H}_k(z)$ is a conjugate transpose of $H_k(z)$;
M is a decimation factor of the unified filter; and
N is a temporal resolution of the prototype filter.

8. The method claimed in claimed 6, wherein the MPEG-1 Layer III CODEC functions substantially in accordance with the following transfer function:

$$T(Z) = \frac{1}{M}\sum_{k=0}^{M-1} F_k(Z)H_k(Z);$$

$$H_k(z) = a_k c_k P_0(zW^{k+0.5}) + a_k^* c_k^* P_0(zW^{-(k+0.5)}), \ 0 \le k \le M-1;$$

$$F_k(z) = b_k c_k P_0(zW^{k+0.5}) + b_k^* c_k^* P_0(zW^{-(k+0.5)}), \ 0 \le k \le M-1; \text{ and}$$

$$F_k(z) = z^{-N}\tilde{H}_k(z);$$

where:
  $H_k(Z)$ is a $k^{th}$ filter of the analysis filter bank;
  $F_k(Z)$ is a $k^{th}$ filter of the synthesis filter bank;
  $\tilde{H}_k(z)$ is a conjugate transpose of $H_k(z)$;
  $\tilde{G}_k(z)$ is a conjugate transpose of $G_k(z)$;
  M is a decimation factor of the unified filter,
  $a_k$, $b_k$ and $c_k$ are unit magnitude constants, wherein:

$$a_k b_k^* = -a_{k-1}b_{k-1}^*, \ 1 \le k \le M-1;$$

$$a_k = e^{j\theta(k)};$$

$$b_k = a_k^* = e^{-j\theta(k)};$$

$$c_k = W^{(k-0.5)N/2}; \text{ and}$$

wherein $\theta(k) = (-1)^k \pi/4$;
* denotes a conjugation of respective coefficients; and $$W = W_{2M} = e^{-j2\pi/2M}.$$

9. The method claimed in claim 6, wherein said prototype filter can be expressed as a vector $h=[h_1 \ h_2 \ h_3 \ldots h_{1631}]^t$ and the polyphase components, $G_k(Z)$, of the prototype filter are:

$$G_0(z) = h_0 + h_{1152}z^{-1}$$

$$G_1(z) = h_1 + h_{1153}z^{-1}$$

$$G_{479}(z) = h_{479} + h_{1631}z^{-1}$$

$$G_{480}(z) = h_{480}$$

$$G_{481}(z) = h_{481}$$

$$G_{1151}(z) = h_{1151}.$$

10. The method claimed in claim 6, wherein said prototype filter is designed through a paraunitary Quadrature Mirror Filter Lattice structure.

11. The method claimed in claim 6, wherein the unified filter bank has a spectral resolution and frequency selectivity of a MPEG-1 Layer III hybrid analysis filter.

12. An MPEG CODEC, comprising:
  an encoder that includes a unified filter bank having a plurality of audio signal filters; and
  a decoder that includes a synthesis filter bank that is a functional inverse of the unified filter bank, wherein the unified filter bank and synthesis filter bank are structured to provide the MPEG CODEC with the following transfer function:

$$T(Z) = \frac{1}{M}\sum_{k=0}^{M-1} F_k(Z)H_k(Z);$$

$$H_k(z) = a_k c_k P_0(zW^{k+0.5}) + a_k^* c_k^* P_0(zW^{-(k+0.5)}), \ 0 \le k \le M-1;$$

-continued $$F_k(z) = b_k c_k P_0(zW^{k+0.5}) + b_k^* c_k^* P_0(zW^{-(k+0.5)}), \ 0 \le k \le M-1; \text{ and}$$

$$F_k(z) = z^{-N}\tilde{H}_k(z);$$

where:
  $H_k(z)$ is a $k^{th}$ filter of the analysis filter bank;
  $F_k(z)$ is a $k^{th}$ filter of the synthesis filter bank;
  $\tilde{H}_k(z)$ is a conjugate transpose of $H_k(z)$;
  $\tilde{G}_k(z)$ is a conjugate transpose of $G_k(z)$;
  M is a decimation factor of the unified filter;
  $a_k$, $b_k$ and $c_k$ are unit magnitude constants;
  * denotes a conjugation of respective coefficients; and
  $W = W_{2M} = e^{-j2\pi/2M}$, wherein where each audio signal filter of the plurality of audio signal filters is a cosine modulation of a prototype filter, $P_0(Z)$, wherein the prototype filter includes a plurality of polyphase components, $G_k(Z)$, which substantially satisfy the following:

$$\tilde{G}_k(z)G_k(z) + \tilde{G}_{M+k}(z)G_{M+k}(z) = \frac{1}{2M}$$

where
  $G_k(z)$, for $0 \le k \le M-1$, are the polyphase components of the prototype filter;
  $\tilde{G}_k(z)$ is a conjugate transpose of $G_k(z)$;
  M is a decimation factor of the prototype filter; and
  k is an integer, wherein the MPEG CODEC is a MPEG-1 Layer III CODEC wherein:
  the prototype filter has a temporal resolution, N, of substantially N+1=1632;
  the decimation factor, M, of the prototype filter is substantially M =576; and
  the prototype filter has a bandwidth of substantially $\pi/M$.

13. The MPEG CODEC of claim 12 wherein the prototype filter can be expressed as a vector $h = [h_1 \ h_2 \ h_3 \ldots h_{1631}]^t$ and the polyphase components, $G_k(z)$, of the prototype filter are:

$$G_0(z) = h_0 + h_{1152}z^{-1}$$

$$G_1(z) = h_1 + h_{1153}z^{-1}$$

$$G_{479}(z) = h_{479} + h_{1631}z^{-1}$$

$$G_{480}(z) = h_{480}$$

$$G_{481}(z) = h_{481}$$

$$G_{1151}(z) = h_{1151}.$$

14. The MPEG CODEC of claim 12 wherein said prototype filter is designed through a paraunitary Quadrature Mirror Filter Lattice structure.

15. The MPEG CODEC of claim 12, wherein:

$$a_k b_k^* = -a_{k-1}b_{k-1}^*, \ 1 \le k \le M-1;$$

$$a_k = e^{j\theta(k)};$$

$$b_k = a_k^* = e^{-j\theta(k)};$$

$$c_k = W^{(k+0.5)N/2}; \text{ and}$$

$$\theta(k) = (-1)^k \pi/4.$$

16. The MPEG CODEC of claim 12, wherein the unified filter bank has a spectral resolution and frequency selectivity of a MPEG-1 Layer III hybrid analysis filter.

17. An MPEG-1 CODEC, comprising:
an encoder that includes means for effecting an analysis filter bank; wherein the means for effecting the analysis filter bank includes a unified filter bank; and
a decoder that includes means for effecting a synthesis filter bank, wherein the means for effecting the synthesis filter bank includes a functional inverse of the unified filter bank, wherein the unified filter bank includes a plurality of audio signal filters, where each audio signal filter of the plurality of audio signal filters is a cosine modulation of a prototype filter, $P_0(Z)$, wherein the prototype filter includes a plurality of polyphase components, $G_k(Z)$, which substantially satisfy the following:

$$\tilde{G}_k(z)G_k(z) + \tilde{G}_{M+k}(z)G_{M+k}(z) = \frac{1}{2M}$$

where
$G_k(z)$, for $0 \leq k \leq M-1$, are the polyphase components of the prototype filter;
$\tilde{G}_k(z)$ is a conjugate transpose of $G_k(z)$;
M is a decimation factor of the prototype filter; and
k is an integer, wherein the prototype filter can be expressed as a vector $h = [h_1\ h_2\ h_3\ \ldots\ h_{1631}]^t$ and the polyphase components, $G_k(z)$, of the prototype filter are:

$G_0(z) = h_0 + h_{1152}z^{-1}$ $G_1(z) = h_1 + h_{1153}z^{-1}$ $G_{479}(z) = h_{479} + h_{1631}z^{-1}$ $G_{480}(z) = h_{480}$ $G_{481}(z) = h_{481}$ $G_{1151}(z) = h_{1151}$.

18. The MPEG-1 CODEC claimed in claim 17, wherein the MPEG-1 CODEC functions substantially in accordance with the following transfer function:

$$T(Z) = \frac{1}{M}\sum_{k=0}^{M-1} F_k(Z)H_k(Z);$$

$h_k(n) = 2p_0(n)\cos(\pi/M(k+0.5)(n-N/2) + \theta_k);$ $f_k(n) = 2p_0(n)\cos(\pi/M(k+0.5)(n-N/2) + \theta_k);$ and $F_k(z) = z^{-N}\tilde{H}_k(z);$ where:
$H_k(Z)$ is a $k^{th}$ filter of the analysis filter bank;
$F_k(Z)$ is a $k^{th}$ filter of the synthesis filter bank;
$\tilde{H}_k(z)$ is a conjugate transpose of $H_k(z)$;
M is a decimation factor of the unified filter; and
N is a temporal resolution of the prototype filter.

19. The MPEG-1 CODEC claimed in claim 17, wherein the MPEG-1 CODEC functions substantially in accordance with the following transfer function:

$$T(Z) = \frac{1}{M}\sum_{k=0}^{M-1} F_k(Z)H_k(Z);$$

$H_k(z) = a_k c_k P_0(zW^{k+0.5}) + a_k^* c_k^* P_0(zW^{-(k+0.5)}), 0 \leq k \leq M-1;$ $F_k(z) = b_k c_k P_0(zW^{k+0.5}) + b_k^* c_k^* P_0(zW^{-(k+0.5)}), 0 \leq k \leq M-1;$ and $F_k(z) = z^{-N}\tilde{H}_k(z);$ Where:
$H_k(Z)$ is a $k^{th}$ filter of the analysis filter bank;
$F_k(Z)$ is a $k^{th}$ filter of the synthesis filter bank;
$\tilde{H}_k(z)$ is a conjugate transpose of $H_k(z)$;
$\tilde{G}_k(z)$ is a conjugate transpose of $G_k(z)$;
M is a decimation factor of the unified filter,
$a_k$, $b_k$ and $c_k$ are unit magnitude constants, wherein:

$a_k b_k^* = -a_{k-1} b_{k-1}^*, 1 \leq k \leq M-1;$ $a_k = e^{j\theta(k)};$ $b_k = a_k^* = e^{-j\theta(k)};$ $c_k = W^{(k+0.5)N/2};$ and wherein $\theta(k) = (-1)^k \pi/4;$
* denotes a conjugation of respective coefficients; and $W = W_{2M} = e^{-2\pi/2M}.$ 20. The MPEG-1 CODEC claimed in claim 17, wherein said prototype filter is designed through a paraunitary Quadrature Mirror Filter Lattice structure.

21. An MPEG CODEC, comprising:
an encoder that includes a unified filter bank having a plurality of audio signal filters; and
a decoder that includes a synthesis filter bank that is a functional inverse of the unified filter bank, wherein the unified filter bank and synthesis filter bank are structured to provide the MPEG CODEC with the following transfer function:

$$T(Z) = \frac{1}{M}\sum_{k=0}^{M-1} F_k(Z)H_k(Z);$$

$H_k(z) = a_k c_k P_0(zW^{k+0.5}) + a_k^* c_k^* P_0(zW^{-(k+0.5)}), 0 \leq k \leq M-1;$ $F_k(z) = b_k c_k P_0(zW^{k+0.5}) + b_k^* c_k^* P_0(zW^{-(k+0.5)}), 0 \leq k \leq M-1;$ and $F_k(z) = z^{-N}\tilde{H}_k(z);$ where:
$H_k(z)$ is a $k^{th}$ filter of the analysis filter bank;
$F_k(Z)$ is a $k^{th}$ filter of the synthesis filter bank;
$\tilde{H}_k(z)$ is a conjugate transpose of $H_k(z)$;
$\tilde{G}_k(z)$ is a conjugate transpose of $G_k(z)$;
M is a decimation factor of the unified filter;
$a_k$, $b_k$ and $c_k$ are unit magnitude constants;
* denotes a conjugation of respective coefficients; and
$W = W_{2M} = e^{-2\pi/2M}$, wherein where each audio signal filter of the plurality of audio signal filters is a cosine modulation of a prototype filter, $P_0(Z)$, wherein the prototype filter includes a plurality of polyphase components, $G_k(Z)$, which substantially satisfy the following:

$$\tilde{G}_k(z)G_k(z) + \tilde{G}_{M+k}(z)G_{M+k}(z) = \frac{1}{2M}$$

where $G_k(z)$, for $0 \leq k \leq M-1$, are the polyphase components of the prototype filter;

$\tilde{G}_k(z)$ is a conjugate transpose of $G_k(z)$;

M is a decimation factor of the prototype filter; and k is an integer, wherein the prototype filter can be expressed as a vector $h = [h_1 \ h_2 \ h_3 \ \ldots \ h_{1631}]^t$ and the polyphase components, $G_k(Z)$, of the prototype filter are:

$G_0(z) = h_0 + h_{1152}z^{-1}$ $G_1(z) = h_1 + h_{1153}z^{-1}$ $G_{479}(z) = h_{479} + h_{1631}z^{-1}$ $G_{480}(z) = h_{480}$ $G_{481}(z) = h_{481}$ $G_{1151}(z) = h_{1151}.$

22. The MPEG CODEC of claim 21, wherein said prototype filter is designed through a paraunitary Quadrature Mirror Filter Lattice structure.

23. The MPEG CODE C of claim 21, wherein:

$a_k b_k^* = -a_{k-1} b_{k-1}^*, \ 1 \leq k \leq M-1$ $a_k = e^{j\theta(k)}$;

$b_k = a_k^* = e^{-j\theta(k)}$;

$c_k = W^{(k+0.5)N/2}$; and $\theta(k) = (-1)^k \pi/4$.

* * * * *